United States Patent
Harrison

(10) Patent No.: US 12,300,654 B2
(45) Date of Patent: May 13, 2025

(54) SEMICONDUCTOR DEVICE WITH METAL SILICIDE LAYER

(71) Applicant: Infineon Technologies AG, Neubiberg (DE)

(72) Inventor: Mark Harrison, Wernberg (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 511 days.

(21) Appl. No.: 17/712,750

(22) Filed: Apr. 4, 2022

(65) Prior Publication Data

US 2023/0317667 A1    Oct. 5, 2023

(51) Int. Cl.
    *H01L 23/00*     (2006.01)
    *H10D 62/832*    (2025.01)

(52) U.S. Cl.
    CPC .............. *H01L 24/27* (2013.01); *H01L 24/29* (2013.01); *H10D 62/8325* (2025.01); *H01L 2224/2781* (2013.01); *H01L 2224/29155* (2013.01); *H01L 2924/048* (2013.01)

(58) Field of Classification Search
    CPC . H01L 24/27; H01L 24/29; H01L 2224/2781; H01L 2224/29155; H01L 2924/048; H01L 22/14; H01L 2224/27; H01L 2224/32; H01L 21/0485; H10D 62/8325
    USPC ......................................................... 257/77
    See application file for complete search history.

(56) References Cited

U.S. PATENT DOCUMENTS

| | | | |
|---|---|---|---|
| 7,985,668 B1* | 7/2011 | Richter | H01L 21/28052 438/655 |
| 2004/0115960 A1* | 6/2004 | Drouin | G03F 7/0043 378/34 |
| 2006/0273323 A1* | 12/2006 | Yamamoto | H01L 29/1608 257/77 |
| 2018/0247772 A1* | 8/2018 | Ahmed | C30B 29/36 |
| 2020/0044031 A1* | 2/2020 | Pham | H10D 62/8325 |
| 2020/0258996 A1* | 8/2020 | Ohse | H10D 62/83 |
| 2021/0020754 A1* | 1/2021 | Nakazawa | H01L 29/417 |
| 2023/0094592 A1* | 3/2023 | Badala' | H10D 62/8325 257/77 |

FOREIGN PATENT DOCUMENTS

| | | | | |
|---|---|---|---|---|
| EP | 3131112 A1 * | 2/2017 | | H01L 21/0485 |
| JP | H11297988 A * | 10/1999 | | |
| RU | 188684 U1 * | 4/2019 | | H01L 29/41 |
| WO | WO-2015122065 A1 * | 8/2015 | | H01L 21/049 |

* cited by examiner

*Primary Examiner* — Mohammad M Hoque
(74) *Attorney, Agent, or Firm* — Cooper Legal Group, LLC

(57) ABSTRACT

A semiconductor device and a method of manufacturing a semiconductor are provided. In an embodiment, a method of manufacturing a semiconductor device is provided. A first surface of a metal silicide layer may be treated with an oxidizing agent to oxidize metal silicide protrusions on the first surface of the metal silicide layer. After treating the first surface with the oxidizing agent, the first surface may be treated with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent.

19 Claims, 8 Drawing Sheets

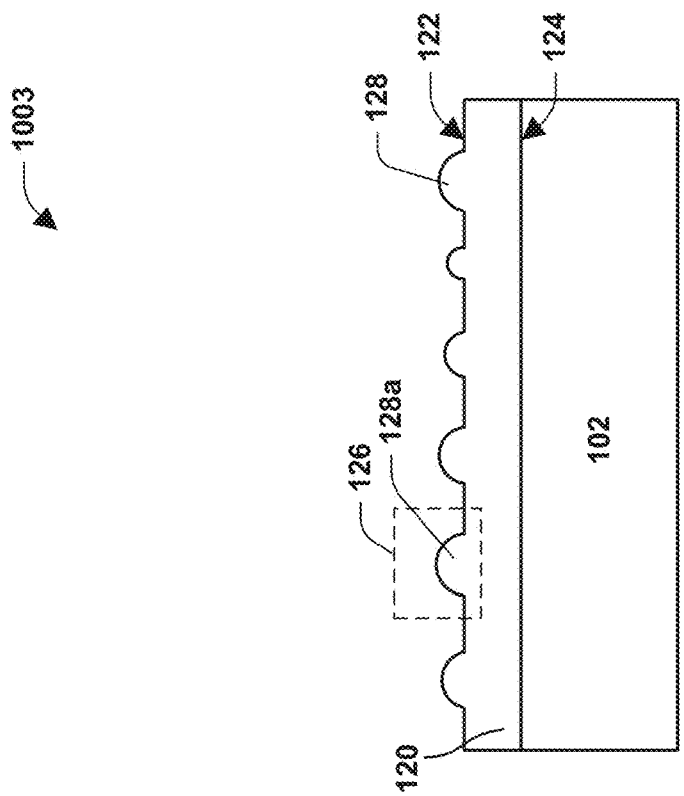
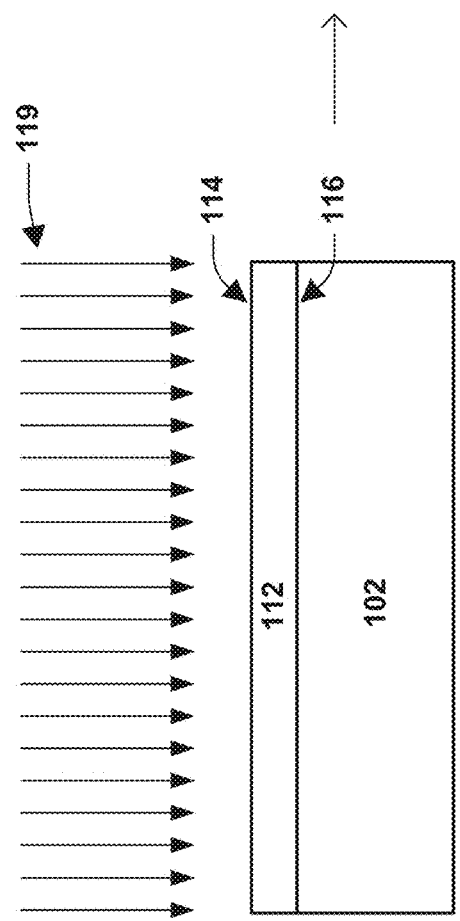
FIG. 1B

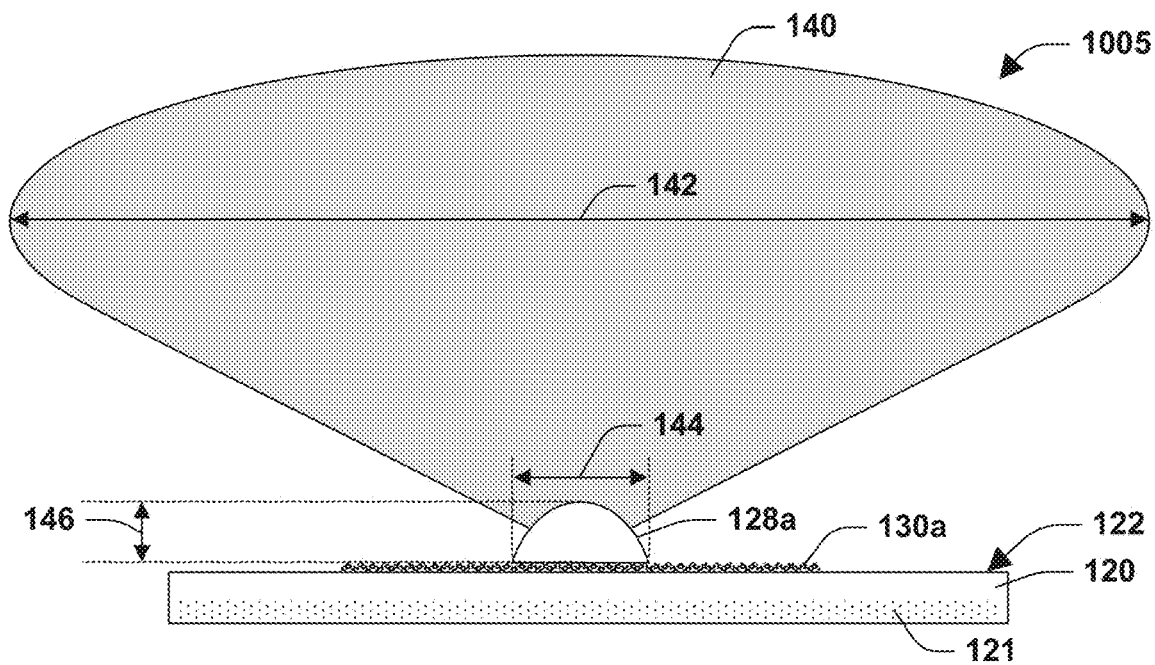
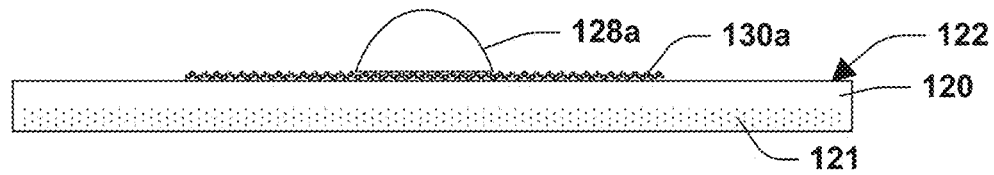
FIG. 1E

200

```
┌─────────────────────────────────────────────────────────────┐
│ TREAT FIRST SURFACE OF METAL SILICIDE LAYER WITH OXIDIZING  │── 202
│ AGENT TO OXIDIZE METAL SILICIDE PROTRUSIONS ON FIRST        │
│ SURFACE OF METAL SILICIDE LAYER                             │
└─────────────────────────────────────────────────────────────┘
                              │
                              ▼
┌─────────────────────────────────────────────────────────────┐
│ AFTER TREATING FIRST SURFACE WITH OXIDIZING AGENT, TREAT    │
│ FIRST SURFACE WITH CLEANING AGENT TO REMOVE OXIDE OVER      │── 204
│ METAL SILICIDE PROTRUSIONS, WHEREIN SIZE OF METAL SILICIDE  │
│ PROTRUSION OF METAL SILICIDE PROTRUSIONS AFTER TREATING     │
│ FIRST SURFACE WITH CLEANING AGENT IS SMALLER THAN SIZE OF   │
│ METAL SILICIDE PROTRUSION PRIOR TO TREATING FIRST SURFACE   │
│ WITH OXIDIZING AGENT                                        │
└─────────────────────────────────────────────────────────────┘
```

FIG. 2

SEMICONDUCTOR DEVICE WITH METAL SILICIDE LAYER

TECHNICAL FIELD

The present disclosure relates to semiconductor devices.

BACKGROUND

A semiconductor device may be used in mobile phones, laptops, desktops, tablets, watches, gaming systems, industrial electronics, commercial electronics, and/or consumer electronics. A semiconductor device may comprise an electrical contact between a semiconductor and a metal that may be used to connect a component within the semiconductor device to external circuitry.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a method of manufacturing a semiconductor device is provided. A first surface of a metal silicide layer may be treated with an oxidizing agent to oxidize metal silicide protrusions on the first surface of the metal silicide layer, wherein the oxidizing agent comprises hydrogen chloride (HCl) and/or hydrogen peroxide ($H_2O_2$). After treating the first surface with the oxidizing agent, the first surface may be treated with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent.

In an embodiment, a method of manufacturing a semiconductor device is provided. A metal silicide layer may be formed over a silicon carbide (SiC) layer. The metal silicide layer has a first surface distal the SiC layer and a second surface proximal the SiC layer. The metal silicide layer has metal silicide protrusions on the first surface. The first surface may be treated with an oxidizing agent to oxidize the metal silicide protrusions. After treating the first surface with the oxidizing agent, the first surface may be treated with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent.

In an embodiment, a semiconductor device is provided. The semiconductor device may comprise a SiC layer. The semiconductor device may comprise a metal silicide layer over the SiC layer. The metal silicide layer has a first surface distal the SiC layer and a second surface proximal the SiC layer. The metal silicide layer has recesses in the first surface, wherein a recess of the recesses extends between about 10 nanometers and about 100 nanometers into the metal silicide layer. The semiconductor device may comprise a metal layer over the metal silicide layer, wherein a portion of the metal layer is within the recesses.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 1B schematically illustrates an act of manufacturing a semiconductor device according to various examples.

FIG. 1E schematically illustrates acts of manufacturing a semiconductor device according to various examples.

FIG. 2 is an illustration of an example method in accordance with the techniques presented herein.

DETAILED DESCRIPTION

Figure 1A:
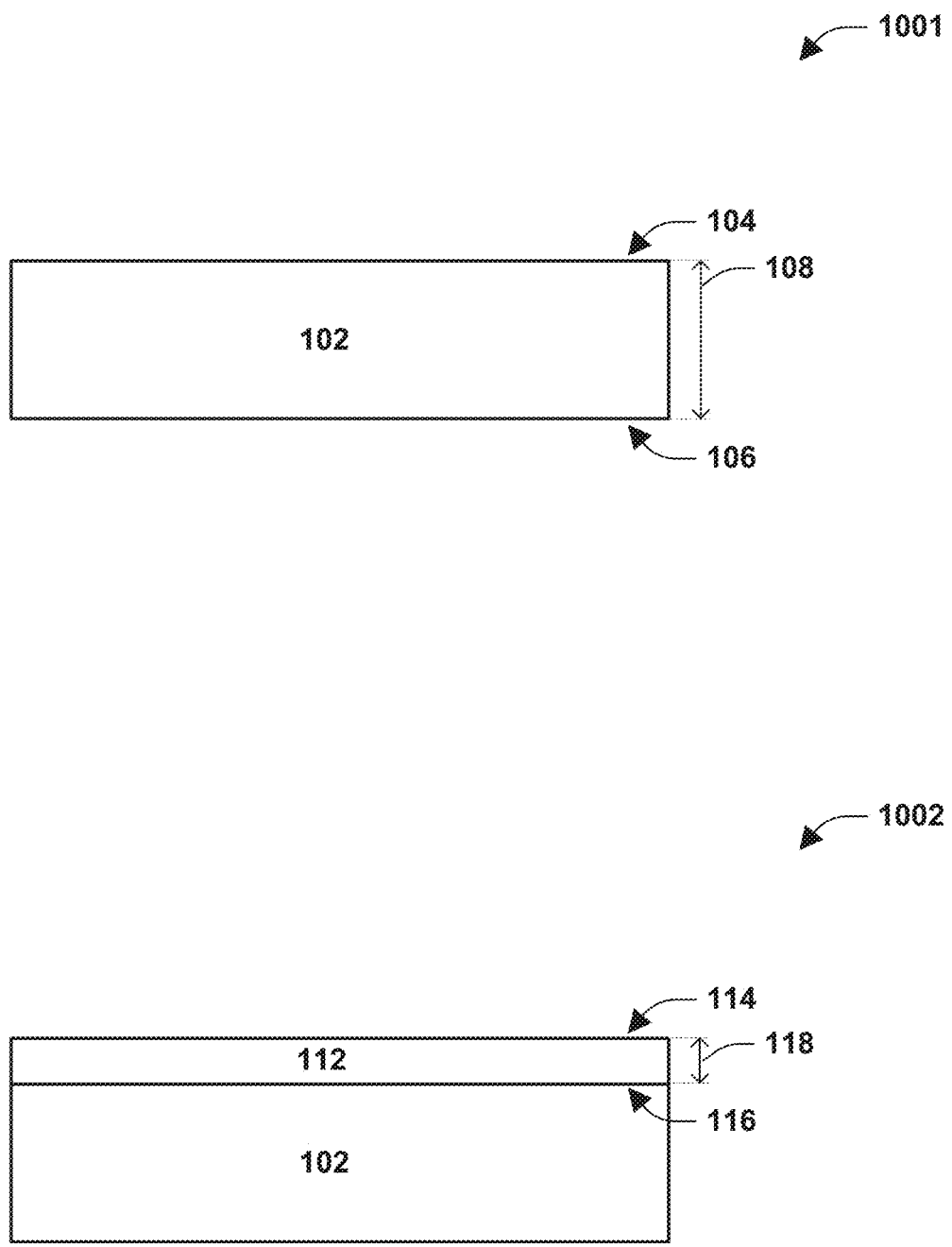
FIG. 1A schematically illustrates acts of manufacturing a semiconductor device according to various examples.
Figure 1C:
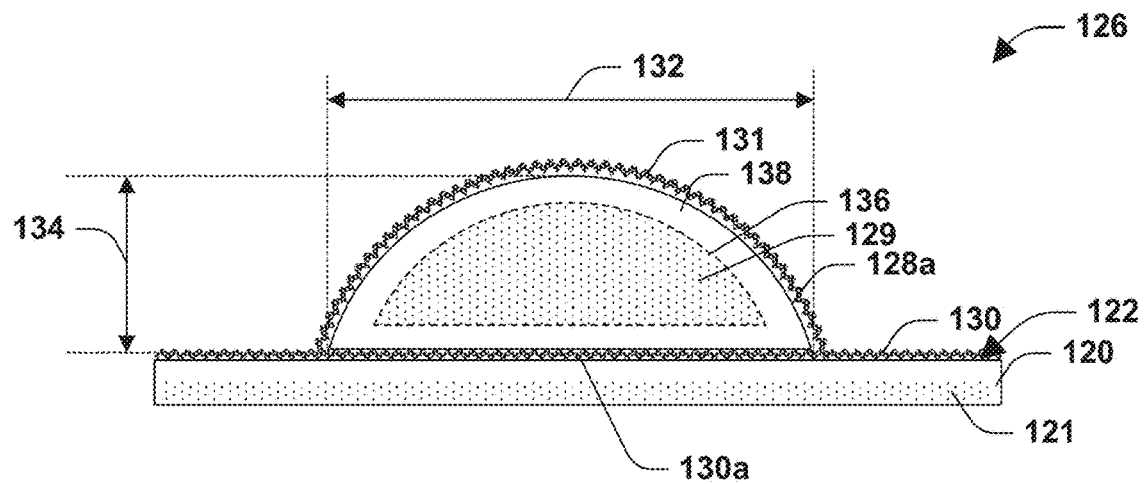
FIG. 1C schematically illustrates a semiconductor device according to various examples.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most 6°) with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

A semiconductor device may comprise an electrical contact (e.g., an Ohmic contact) between a semiconductor and a metal. The electrical contact may be formed using a metal silicide layer between the semiconductor and the metal. A surface of the metal silicide layer may have protrusions (e.g., metal silicide protrusions, such as local peaks in elevation of the metal silicide layer, such as bumps, hills and/or hillocks). The protrusions on the surface of the metal silicide layer may result in protrusions of a surface (e.g., back side surface) of the metal. For example, the metal silicide layer having larger protrusions may result in the surface of the metal having larger protrusions. In some examples, the surface of the metal may be electrically connected to a component, such as at least one of a measuring chuck for wafer testing, a lead frame, etc. Larger protrusions of the surface may reduce a conductivity of the electrical connection between the metal and the component, such as due to increased voids between the metal and the component.

In accordance with the present disclosure, a semiconductor device and a method of manufacturing the semiconductor device are provided. The semiconductor device may comprise a metal silicide layer. Using one or more of the techniques provided herein, one or more treatments are performed on a surface of the metal silicide layer. The one or more treatments may reduce sizes of metal silicide protrusions on the surface. In an example, the one or more treatments may comprise: (i) treating the surface of the metal silicide layer with an oxidizing agent to oxidize metal silicide protrusions on the surface, and/or (ii) treating the surface of the metal silicide layer with a cleaning agent to remove oxide over the metal silicide protrusions. One or more metal layers may be formed over the metal silicide layer (e.g., the metal silicide layer may provide an electrical contact between the one or more metal layers and a semiconductor layer underlying the metal silicide layer). The reduced sizes of metal silicide protrusions on the surface may provide for an improved electrical contact (e.g., Ohmic contact) between the one or more metal layers and the semiconductor layer, and/or higher conductivity between the one or more metal layers and a component connected to the one or more metal layers, thereby providing for improved operation and/or performance of the semiconductor device.

In an embodiment of the presently disclosed embodiments, a method of manufacturing a semiconductor device is provided. The method may comprise treating a first surface of a metal silicide layer with an oxidizing agent to oxidize metal silicide protrusions (e.g., local peaks in elevation of the metal silicide layer, such as bumps, hills and/or hillocks) on the first surface of the metal silicide layer. The oxidizing agent may comprise one or more oxidizing chemicals and/or one or more cleaning and/or etching chemicals. The one or more cleaning and/or etching chemicals of the oxidizing agent may etch away metal of the metal silicide protrusions. In an example, the one or more cleaning and/or etching chemicals of the oxidizing agent comprise hydrogen chloride (HCl) (e.g., hydrochloric acid), hydrogen fluoride (HF) (e.g., hydrofluoric acid), ammonium fluoride ($NH_4F$), and/or one or more other chemicals. The one or more oxidizing chemicals may oxidize silicon, metal and/or metal silicide of the metal silicide protrusions. In an example, the one or more oxidizing chemicals comprise hydrogen peroxide ($H_2O_2$) and/or one or more other chemicals. In an example, the oxidizing agent comprises hydrogen chloride, such as hydrochloric acid, and/or hydrogen peroxide (e.g., the oxidizing agent may comprise hydrochloric acid and hydrogen peroxide). In some examples, treating the first surface of the metal silicide layer with the oxidizing agent may be performed using one or more of the techniques provided herein with respect to the second treatment shown in and/or described with respect to FIGS. 1A-1F.

The method may comprise, after treating the first surface of the metal silicide layer with the oxidizing agent, treating the first surface with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent. In some examples, the oxide removed via treating the first surface with the cleaning agent may comprise oxide (e.g., silicon oxide ($SiO_x$), metal oxide such as nickel oxide, and/or metal silicide oxide such as nickel silicate (NiSiO)) formed via treating the first surface with the oxidizing agent. The cleaning agent may comprise one or more cleaning and/or etching chemicals, such as one or more gases, liquids and/or plasmas used for cleaning semiconductor surfaces and/or etching. The one or more cleaning and/or etching chemicals of the cleaning agent may etch away the oxide over the metal silicide protrusions. In an example, the cleaning agent comprises hydrogen fluoride (e.g., hydrofluoric acid), ammonium fluoride, hydrogen chloride (e.g., hydrochloric acid), and/or one or more other chemicals. In some examples, treating the first surface of the metal silicide layer with the cleaning agent may be performed using one or more of the techniques provided herein with respect to the third treatment shown in and/or described with respect to FIGS. 1A-1F.

For each metal silicide protrusion of one, some and/or all metal silicide protrusions on the first surface of the metal silicide layer, a size of the metal silicide protrusion after treating the first surface with the cleaning agent is smaller than a size of the metal silicide protrusion prior to treating the first surface with the oxidizing agent.

The method may comprise, prior to treating the first surface with the oxidizing agent, removing carbon on the first surface of the metal silicide layer. In some examples, removing the carbon comprises treating the first surface with oxygen plasma. In some examples, removing the carbon may be performed using one or more of the techniques provided herein with respect to act 1004 (shown in and/or described with respect to FIG. 1D).

In some examples, oxide residue from the oxygen plasma remains on the first surface after treating the first surface with the oxygen plasma. The oxide residue may comprise metal oxide and/or silicon oxide (e.g., the oxide residue may be formed as a result of treating the first surface with the oxygen plasma). The method may comprise, prior to treating the first surface with the oxidizing agent, removing the oxide residue from the first surface. Removing the oxide residue may comprise treating the first surface with a second cleaning agent. The second cleaning agent may comprise one or more cleaning and/or etching chemicals, such as one or more gases, liquids and/or plasmas used for cleaning semiconductor surfaces and/or etching. The one or more cleaning and/or etching chemicals of the second cleaning agent may etch away the oxide residue and/or may etch away silicon oxide particles formed during formation of the metal silicide layer. In an example, the second cleaning agent comprises hydrogen fluoride (e.g., hydrofluoric acid), ammonium fluoride, hydrogen chloride (e.g., hydrochloric acid), and/or one or more other chemicals. In some examples, treating the first surface of the metal silicide layer with the second cleaning agent may be performed using one or more of the techniques provided herein with respect to the first treatment described with respect to FIGS. 1A-1F.

In some examples, a first treatment time of treating the first surface with the cleaning agent is longer than a second treatment time of treating the first surface with the second cleaning agent. Alternatively and/or additionally, the first treatment time may be shorter than the second treatment time. Alternatively and/or additionally, the first treatment time may be about the same as the second treatment time.

The method may comprise forming a first layer over a semiconductor layer, such as a semiconductor substrate. In some examples, the semiconductor layer is a silicon carbide (SiC) layer, such as a SiC substrate. The first layer comprises a metal. In some examples, the metal comprises nickel, titanium, tantalum, tungsten, molybdenum, nickel aluminide (NiAl), titanium nitride (TiN), tantalum nitride (TaN), molybdenum nitride (MoN), tungsten nitride (WN) and/or other metal.

The method may comprise forming the metal silicide layer from the metal of the first layer and silicon of the semiconductor layer. In some examples, forming the metal silicide layer comprises directing thermal energy to the first layer to form the metal silicide layer. In some examples, the thermal energy comprises energy, introduced to the first layer and/or the semiconductor layer, via a laser that illuminates at least a portion of a top surface of the first layer. For example, the laser may comprise a laser pulse output by a laser source. In some examples, the thermal energy may comprise energy, introduced to the first layer and/or the semiconductor layer, via multiple laser pulses (e.g., the multiple laser pulses may be output by the laser source to illuminate different sections of the top surface of the first layer). Alternatively and/or additionally, the laser may comprise a continuous laser output by the laser source.

In some examples, the first layer comprises silicon (in addition to the metal, for example). The silicon of the first layer may suppress carbon release during formation of the metal silicide layer.

In an embodiment of the presently disclosed embodiments, a semiconductor device is provided. The semiconductor device may comprise a semiconductor layer, such as a semiconductor substrate. In some examples, the semiconductor layer is a SiC layer, such as a SiC substrate. The semiconductor device may comprise a metal silicide layer over the semiconductor layer. The metal silicide layer has a first surface distal the semiconductor layer and a second surface proximal the semiconductor layer. The metal silicide layer has recesses (e.g., craters) in the first surface (such as recesses 208 shown in and/or described with respect to FIG. 1F). Each recess of one, some and/or all of the recesses extends between about 10 nanometers and about 100 nanometers into the metal silicide layer, such as between about 10 nanometers and about 70 nanometers into the metal silicide layer (e.g., a depth of a recess in the first surface may be in the range of at least 10 nanometers to about 100 nanometers, such as in the range of at least 10 nanometers to about 70 nanometers). The semiconductor device may comprise a metal layer over the metal silicide layer, wherein a portion of the metal layer is within the recesses.

In some examples, a thickness of the metal silicide layer is less than 300 nanometers. Alternatively and/or additionally, the thickness of the metal silicide layer may be at least 10 nanometers or at least 20 nanometers.

In some examples, the metal silicide layer comprises nickel silicide and/or other metal silicide.

FIGS. 1A-1F illustrate aspects with respect to manufacturing a semiconductor device according to various examples of the present disclosure. At 1001 (illustrated in FIG. 1A), a semiconductor layer 102 is provided. The semiconductor layer 102 may comprise crystalline semiconductor material. The semiconductor layer 102 may comprise a semiconductor element (e.g., silicon, germanium, and/or other semiconductor element) and/or a semiconductor compound (e.g., SiC, silicon germanium (SiGe), gallium arsenide (GaAs), gallium nitride (GaN) and/or other semiconductor compound). The semiconductor layer 102 may comprise dopants (e.g., nitrogen (N), phosphorus (P), beryllium (Be), boron (B), aluminum (Al), gallium (Ga) and/or other dopants). Alternatively and/or additionally, the semiconductor layer 102 may comprise impurities (e.g., hydrogen, fluorine, oxygen and/or other impurities). In some examples, the semiconductor layer 102 is a semiconductor substrate, such as a SiC substrate. A thickness 108 of the semiconductor layer 102 may be in the range of at least 2 micrometers to at most 800 micrometers. The semiconductor layer 102 has a first surface 104 and a second surface 106 opposite the first surface 104. In some examples, the first surface 104 corresponds to a back side of the semiconductor layer 102 (e.g., a wafer back side). In some examples, the second surface 106 corresponds to a front side of the semiconductor layer 102 (e.g., a wafer front side).

At 1002 (illustrated in FIG. 1A), a first layer 112 is formed over the semiconductor layer 102. The first layer 112 comprises a metal. In some examples, the metal comprises nickel, titanium, tantalum, tungsten, molybdenum, NiAl, TiN, TaN, MoN, WN and/or other metal. The first layer 112 may overlie the semiconductor layer 102. In some examples, the first layer 112 may comprise a non-metal (in addition to the metal, for example), such as silicon, for suppression of carbon release during metal silicide formation from the first layer 112 and the semiconductor layer 102. In an example, the first layer 112 comprises nickel and silicon, wherein the nickel may be present in the range of at least 2 weight % to at most 95 weight %, the range of at least 2 weight % to at most 50 weight %, the range of at least 6 weight % to at most 16 weight %, and/or the range of at least 10 weight % to at most 12 weight %. In an example, in the first layer 112, the nickel may be present at about 11 weight % and/or about 20 atomic %. The first layer 112 has a first surface 114 distal the semiconductor layer 102 and a second surface 116 proximal the semiconductor layer 102. In some examples, the first surface 114 of the first layer 112 may be adjacent to and/or may be in contact (e.g., direct contact) with the first surface 104 of the semiconductor layer 102. In some examples, the first layer 112 is formed via a sputtering process comprising sputtering the first layer 112 on the first surface 104 of the semiconductor layer 102. The first layer 112 has a thickness 118 of less than 200 nanometers. The thickness 118 of the first layer 112 may be in the range of at least 10 nanometers to at most 200 nanometers, in the range of at least 10 nanometers to at most 100 nanometers, and/or in the range of at least 10 nanometers to at most 30 nanometers.

At 1003 (illustrated in FIG. 1B), thermal energy 119 is directed to the first layer 112 to form a metal silicide layer 120 from the metal of the first layer 112 and silicon of the semiconductor layer 102. For example, the thermal energy 119 may be directed to the first surface 114 of the first layer 112. The metal silicide layer 120 has a first surface 122 distal the semiconductor layer 102 and a second surface 124 proximal the semiconductor layer 102. In some examples, the metal silicide layer 120 forms an electrical contact, such as an ohmic contact, between the semiconductor layer 102 and one or more metal layers (e.g., one or more metal layers 406 shown in FIG. 4). For example, the metal silicide layer 120 may provide a connection between external circuitry and one or more components disposed in the semiconductor device, such as one or more components embedded in the semiconductor layer 102. In some examples, the one or more components disposed in the semiconductor device comprise a transistor comprising an insulated-gate bipolar transistor (IGBT), a field-effect transistor (FET), a metal-oxide-semiconductor FET (MOSFET) and/or other type of transistor. In an example, the electrical contact may be connected to and/or may correspond to a drain of the transistor, such as a drain of a MOSFET. In some examples, the one or more components disposed in the semiconductor device comprise a diode, wherein the electrical contact may be connected to and/or may correspond to an electrode of the diode.

In an example in which the first layer 112 comprises nickel, a weight % of nickel present in the metal silicide layer 120 may be higher than a weight of nickel present in the first layer 112 (e.g., directing the thermal energy 119 to the first layer 112 may result in formation of the metal silicide layer 120 having a higher weight % of nickel than the first layer 112). In an example, the metal silicide layer 120 comprises nickel, wherein the nickel may be present in the range of at least 2 weight % to at most 96 weight %, the range of at least 2 weight % to at most 55 weight %, the range of at least 7 weight to at most 18 weight %, and/or the range of at least 11 weight % to at most 13 weight %. In an example in which nickel is present in the first layer 112 at about 11 weight %, nickel may be present in the metal silicide layer 120 at about 12 weight %.

In some examples, the thermal energy 119 is directed to the first surface 114 of the first layer 112 to heat at least a portion of the first layer 112 and/or at least a portion of the semiconductor layer 102 to a first temperature, wherein the first temperature may be in the range of at least 900° Celsius to at most 1300° Celsius, in the range of at least 950° Celsius to at most 1100° Celsius, and/or in the range of at least 970° Celsius to at most 1010° Celsius. The thermal energy 119 being directed to the first surface 114 of the first layer 112 melts metal of the first layer 112 and/or causes a silicidation reaction to occur. In an example in which the first layer 112 comprises nickel and the semiconductor layer 102 comprises SiC, the silicidation reaction may comprise $SiC+2Ni \rightarrow Ni_2Si+C$.

In some examples, act 1003 is performed such that one or more portions of the semiconductor device are not heated to the first temperature. In an example, the thermal energy 119 may be directed to the first surface 114 of the first layer 112 such that the silicidation reaction occurs without damaging one or more components disposed in the one or more portions of the semiconductor device (e.g., the thermal energy 119 may be localized to a first portion of the semiconductor device to cause the silicidation reaction, wherein the first portion may comprise at least some of the first layer 112 and/or at least some of the semiconductor device). In some examples, the one or more portions of the semiconductor device may comprise a portion of the semiconductor layer 102 proximal the second surface 106 of the semiconductor layer 102 (e.g., the one or more components are disposed in the portion of the semiconductor layer 102). In an example, act 1003 comprises performing one or more laser shots on the first surface 114 of the first layer 112. For example, act 1003 may comprise performing a laser thermal annealing (LTA) process comprising the one or more laser shots.

The metal silicide layer 120 has metal silicide protrusions 128 on the first surface 122. A metal silicide protrusion of the metal silicide protrusions 128 may correspond to a local peak in elevation of the metal silicide layer 120, such as a bump, a hill and/or a hillock.

FIG. 10 illustrates a detailed and/or enlarged view of a section 126 of the semiconductor device comprising a metal silicide protrusion 128a of the metal silicide protrusions 128. An outline of the section 126 is shown with a dashed-line box in FIG. 1B. A height 134 (shown in FIG. 10) of the metal silicide protrusion 128a may be in the range of at least 100 nanometers to at most 1000 nanometers. A width 132 of the metal silicide protrusion 128a may be in the range of at least 200 nanometers to at most 1500 nanometers, and/or in the range of at least 500 nanometers to at most 1000 nanometers.

In some examples, carbon from the semiconductor layer 102 (e.g., the SiC substrate) may defuse into the metal silicide layer 120 during formation of the metal silicide layer 120 (e.g., when act 1003 is performed). Including silicon in the first layer 112 may reduce the amount of carbon present in and/or on the metal silicide layer 120. In an example, one or more carbon layers (e.g., one or more graphitic carbon layers) may be formed (as a result of performing act 1003, for example) on the first surface 122 of the metal silicide layer 120 and/or on the metal silicide protrusions 128. The one or more carbon layers may comprise a first carbon layer 130 over the first surface 122 of the metal silicide layer 120 (e.g., the first carbon layer 130 may be in contact with the first surface 122 of the metal silicide layer 120) and/or a second carbon layer 131 over the metal silicide protrusion 128a (e.g., the second carbon layer 131 may be in contact with a top surface of the metal silicide protrusion 128a). Alternatively and/or additionally, carbon clusters may be formed (as a result of performing act 1003, for example) in the metal silicide layer 120 and/or in the metal silicide protrusions 128. In an example, the carbon clusters may comprise fullerenes (e.g., at least one of $C_{60}$ fullerenes, buckyballs, bucky onions, carbon freckles, etc.). The carbon clusters may comprise first carbon clusters 129 (shown with black dots in FIG. 10) within the metal silicide protrusion 128a. For example, the first carbon clusters 129 may be within a carbon cluster region 136 of the metal silicide protrusion 128a (e.g., boundaries of the carbon cluster region 136 is shown with a dashed-line in FIG. 10). In some examples, the metal silicide protrusion 128a may comprise a carbon cluster-free region 138 in which carbon clusters are nonexistent or in which there is a lower density of carbon clusters compared to the carbon cluster region 136. The carbon cluster-free region 138 may correspond to an outer portion, of the metal silicide protrusion 128a, between the carbon cluster region 136 and outer edges of the metal silicide protrusion 128a. Alternatively and/or additionally, the carbon clusters may comprise second carbon clusters 121 (shown with black dots in FIG. 10) within the metal silicide layer 120.

In some examples, silicon oxide particles (not shown) may be formed during formation of the metal silicide layer 120 (e.g., when act 1003 is performed). At least some of the silicon oxide particles may be formed on and/or within a carbon layer of the one or more carbon layers, at least some of the silicon oxide particles may be formed on and/or within the metal silicide layer 120 and/or at least some of the silicon oxide particles may be formed on and/or within the metal silicide protrusions 128.

Figure 1D:
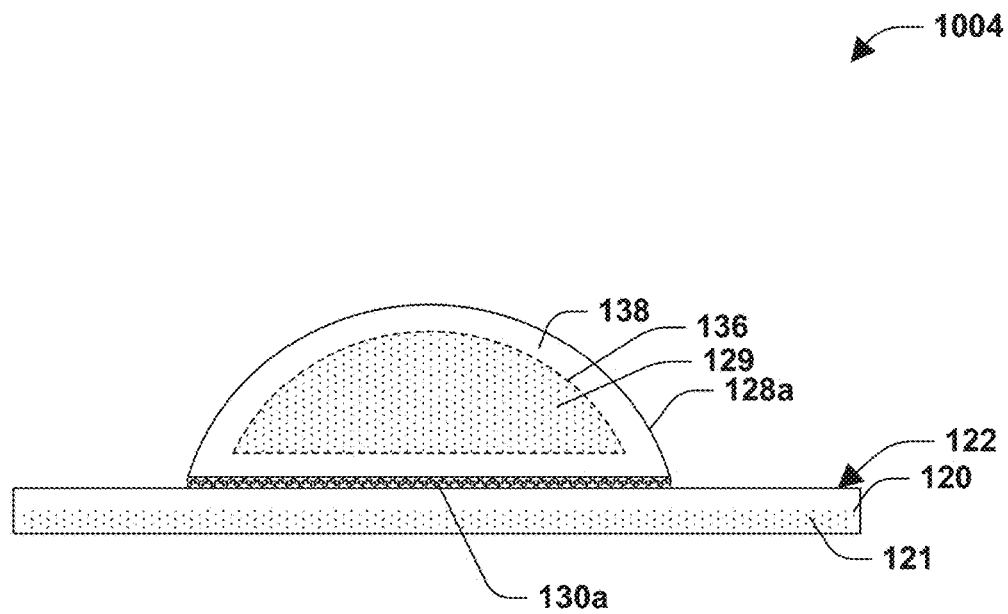
FIG. 1D schematically illustrates an act of manufacturing a semiconductor device according to various examples.

Acts 1004-1006 are shown in and/or described with respect to FIGS. 1D and 1E. FIGS. 1D and 1E provide detailed and/or enlarged views of the section 126 of the semiconductor device to provide for clarity in describing and/or showing aspects and/or effects associated with acts 1004-1006.

At 1004 (illustrated in FIG. 1D), carbon on the first surface 122 of the metal silicide layer 120 (e.g., at least some of the first carbon layer 130 shown in FIG. 10) and/or carbon on metal silicide protrusions 128 (e.g., at least some of the second carbon layer 131 shown in FIG. 10) may be removed. In some examples, the carbon on the first surface 122 and/or the carbon on the metal silicide protrusions 128 is removed by treating the first surface 122 and/or the metal silicide protrusions 128 with oxygen plasma. For example, the oxygen plasma may be applied to the first surface 122 and/or the metal silicide protrusions 128 of the metal silicide layer 120 (by performing an $O_2$ flash, for example). In some examples, at least some carbon that is not exposed and/or is covered is not removed in act 1004. For example, a portion 130*a*, of the first carbon layer 130, that underlies the metal silicide protrusion 128*a* may remain after act 1004 is performed. Alternatively and/or additionally, oxide residue from the oxygen plasma may remain on the first surface 122 and/or on the metal silicide protrusions 128 after treating the first surface 122 with the oxygen plasma. In some examples, the oxide residue may comprise metal oxide (e.g., nickel oxide in a scenario in which the metal silicide layer 120 is formed from a layer comprising nickel) and/or silicon oxide (e.g., the oxide residue may be formed as a result of applying the oxygen plasma to the first surface 122 and/or the metal silicide protrusions 128, such as due to reactions between the oxygen plasma and material of the metal silicide layer 120).

In some examples, a planarization process may be performed to reduce sizes of the metal silicide protrusions 128 of the metal silicide layer 128 and/or reduce a surface roughness of the first surface 122 of the metal silicide layer 128. The planarization process may comprise a first treatment, a second treatment and/or a third treatment.

In some examples, the first treatment is performed (after performing act 1004, for example) on the metal silicide layer 120 to remove one or more oxides on the first surface 122 of the metal silicide layer 120 and/or on the metal silicide protrusions 128. For example, the one or more oxides may comprise at least some of the silicon oxide particles (formed during formation of the metal silicide layer 120, for example), such as silicon oxide particles on the first surface 122 and/or on the metal silicide protrusions 128. Alternatively and/or additionally, the one or more oxides may comprise at least some of the oxide residue. In some examples, the first treatment comprises treating the first surface 122 with a first cleaning agent (e.g., the first cleaning agent may be applied to the first surface 122 and/or the metal silicide protrusions 128). In some examples, the first cleaning agent comprises one or more cleaning and/or etching chemicals, such as one or more gases, liquids and/or plasmas used for cleaning semiconductor surfaces and/or etching. In an example, the first cleaning agent comprises hydrogen fluoride (e.g., hydrofluoric acid), ammonium fluoride, hydrogen chloride (e.g., hydrochloric acid), and/or one or more other chemicals. In an example, the first cleaning agent comprises hydrofluoric acid, wherein a concentration of the hydrofluoric acid in the first cleaning agent is at most 10%, such as in the range of at least 0.1% to at most 5%, and/or in the range of at least 0.1% to at most 2%. In some examples, the first treatment comprises spraying (using a spray cleaning tool, for example) the first cleaning agent on the first surface 122 (e.g., such that the first cleaning agent is applied to the first surface 122 and/or the metal silicide protrusions 128). In some examples, a first treatment time of the first treatment (e.g., a duration of time that the metal silicide layer 120 is treated with and/or reacts with the first cleaning agent) is at most 120 seconds, such as in the range of at least 5 seconds to at most 60 seconds, in the range of at least 10 seconds to at most 20 seconds, in the range of at least 25 seconds to at most 35 seconds, and/or in the range of at least 40 seconds to at most 50 seconds.

At 1005 (illustrated in FIG. 1E), the second treatment is performed (after performing the first treatment, for example) on the metal silicide layer 120 to oxidize metal silicide protrusions 128 on the first surface 122 of the metal silicide layer 120. In some examples, the second treatment comprises treating the first surface 122 with an oxidizing agent (e.g., the oxidizing agent may be applied to the first surface 122 and/or the metal silicide protrusions 128). In some examples, application of the oxidizing agent to the first surface 122 and/or the metal silicide protrusions 128 converts at least a portion of the metal silicide protrusions 128 to oxide, such as at least one of metal oxide, silicon oxide, metal silicon oxide, etc. In an example, the oxidizing agent comprises one or more cleaning and/or etching chemicals, such as one or more gases, liquids and/or plasmas, that etch away metal of the metal silicide protrusions 128. Alternatively and/or additionally, the oxidizing agent may comprise one or more oxidizing chemicals, such as one or more gases, liquids and/or plasmas, that oxidize at least some of the metal silicide protrusions 128. For example, the one or more oxidizing chemicals may convert metal silicide of the metal silicide protrusions 128 to oxide (e.g., nickel silicate in a scenario in which the metal silicide layer 120 is formed from a layer comprising nickel). Alternatively and/or additionally, the one or more oxidizing chemicals may convert metal of the metal silicide protrusions 128 to metal oxide (e.g., nickel oxide in a scenario in which the metal silicide layer 120 is formed from a layer comprising nickel). Alternatively and/or additionally, one or more oxidizing chemicals may convert silicon of the metal silicide protrusions 128 to silicon oxide. In an example, the one or more cleaning and/or etching chemicals of the oxidizing agent may comprise hydrogen chloride (e.g., hydrochloric acid), hydrogen fluoride (e.g., hydrofluoric acid), ammonium fluoride, and/or one or more other chemicals. In an example, the one or more oxidizing chemicals of the oxidizing agent comprise hydrogen peroxide and/or one or more other chemicals. In an example, the oxidizing agent comprises hydrochloric acid (e.g., the hydrochloric acid etches one or more portions of the metal silicide protrusions 128, such as metal of the metal silicide protrusions 128) and hydrogen peroxide (e.g., the hydrogen peroxide oxidizes one or more portions of the metal silicide protrusions 128, such as silicon, metal and/or metal silicide of the metal silicide protrusions 128). In some examples, compared to a reaction of the oxidizing agent with parts of the metal silicide layer 120 other than the metal silicide protrusions 128 (e.g., a main body of the metal silicide layer 120 on which the metal silicide protrusions 128 are disposed), the oxidizing agent reacts more strongly with the metal silicide protrusions 128, such as where a rate at which the oxidizing agent etches and/or oxidizes the metal silicide protrusions 128 is greater than a rate at which the oxidizing agent etches and/or oxidizes the main body of the metal silicide layer 120. Accordingly, the second treatment using the oxidizing agent may preferentially etch and/or oxidize the metal silicide protrusions 128 while not etching and/or oxidizing the other parts of the metal silicide layer 120 (e.g., the main body of the metal silicide layer 120) and/or while etching and/or oxidizing the other parts of the metal silicide layer 120 at a lower rate than the metal silicide protrusions 128. In some examples, the second treatment comprises spraying (using a spray cleaning tool, for example) the oxidizing agent on the first surface 122 (e.g., such that the oxidizing agent is applied to the first surface 122 and/or the metal silicide protrusions 128). In some examples, a second treatment time of the second treatment (e.g., a duration of time that the metal silicide layer 120 is treated with and/or reacts with the oxidizing agent) is at most 480 seconds, such as in the range of at least 30 seconds to at most 270 seconds, in the range of at least 30 seconds to at most 90 seconds, in the range of at least 90 seconds to at most 150 seconds, and/or in the range of at least 210 seconds to at most 270 seconds.

In some examples, the second treatment comprises treating the first surface 122 of the metal silicide layer 120 with the one or more oxidizing chemicals (e.g., hydrogen peroxide) of the oxidizing agent and the one or more cleaning and/or etching chemicals (e.g., hydrochloric acid) of the oxidizing agent together and/or concurrently, such as by applying a mixture and/or solution, comprising the one or more oxidizing chemicals and the one or more cleaning and/or etching chemicals, to the first surface 122 and/or the metal silicide protrusions 128. Alternatively and/or additionally, the second treatment may comprise applying the one or more oxidizing chemicals separately from the one or more cleaning and/or etching chemicals. In an example in which the one or more oxidizing chemicals and the one or more cleaning and/or etching chemicals are applied separately, the second treatment may comprise applying the one or more cleaning and/or etching chemicals, followed by applying the one or more oxidizing chemicals, or vice versa. Alternatively and/or additionally, the second treatment may comprise performing a plurality of treatment acts, wherein each treatment act of the plurality of treatment acts comprises applying the one or more cleaning and/or etching chemicals, followed by applying the one or more oxidizing chemicals, or vice versa.

Figure 1F:
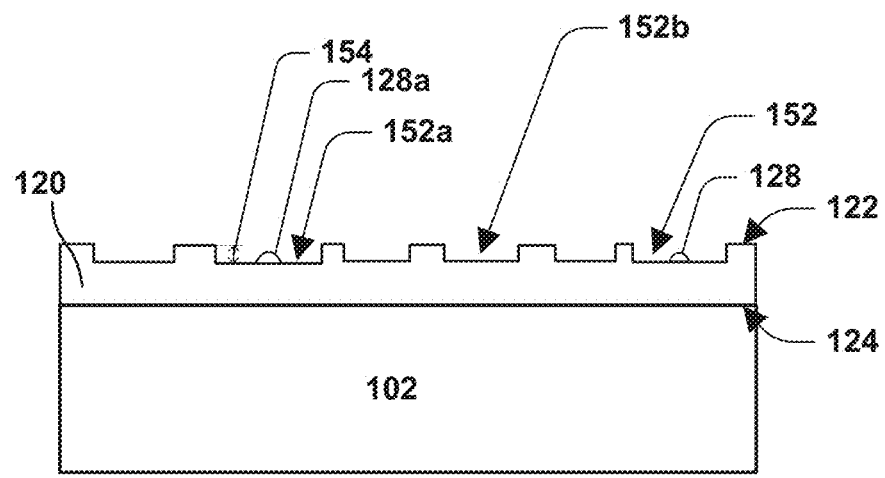
FIG. 1F schematically illustrates a semiconductor device according to various examples.

In an example, the second treatment forms an oxide structure 140 from the metal silicide protrusion 128*a*. For example, the oxide structure 140 may be formed via the oxidizing agent reacting with at least some of the metal silicide protrusion 128*a*. In an example, the oxide structure 140 overlies the metal silicide protrusion 128*a*. The oxide structure 140 may comprise oxide (e.g., silicon oxide, metal oxide such as nickel oxide, and/or metal silicide oxide such as nickel silicate), carbon and/or silicon. In some examples, a width 142 of the oxide structure 140 may be in the range of at least 200 nanometers to at most 2000 nanometers, and/or in the range of at least 500 nanometers to at most 1500 nanometers. In some examples, one or more dimensions (e.g., a volume, a height, and/or the width 142) of the oxide structure 140 may be larger than one or more dimensions (e.g., a volume, the height 134, and/or the width 132) of the metal silicide protrusion 128*a* before the second treatment. For example, the volume, the height and/or the width 142 of the oxide structure 140 may be between about 120% and about 150% of the volume, the height 134, and/or the width 132 of the metal silicide protrusion 128*a* before the second treatment, respectively. In some examples, the second treatment reduces a size of the metal silicide protrusion 128*a*. The size of the metal silicide protrusion 128*a* may be reduced as a result of the oxidizing agent etching at least some of the metal silicide protrusion 128*a* (e.g., etching metal of the metal silicide protrusion 128*a*) and/or converting at least some of the metal silicide protrusion 128*a* into oxide (e.g., oxidizing at least some of the metal silicide protrusion 128*a*, such as silicon, metal and/or metal silicide of the metal silicide protrusion 128*a*, to form the oxide structure 140). A second height 146 of the metal silicide protrusion 128*a* (e.g., a height of the metal silicide protrusion 128*a* after the second treatment) may be in the range of at least 5 nanometers to at most 400 nanometers, such as in the range of at least 40 nanometers to at most 200 nanometers. Alternatively and/or additionally, the metal silicide protrusion 128*a* may be removed completely via performing the first treatment, the second treatment and/or the third treatment (e.g., the second height 146 may be 0 nanometers). For example, the metal silicide protrusion 128*a* and/or a portion of the metal silicide layer 120 that is proximal the metal silicide protrusion 128*a* may be removed (e.g., lifted off) during the third treatment (e.g., removal of the portion of the metal silicide layer 120 may form a recess, such as a crater, in the first surface 122 of the metal silicide layer 120, such as shown in FIG. 1F). A second width 144 of the metal silicide protrusion 128*a* (e.g., a width of the metal silicide protrusion 128*a* after the second treatment) may be in the range of at least 5 nanometers to at most 400 nanometers, such as in the range of at least 40 nanometers to at most 200 nanometers. Alternatively and/or additionally, the second width 144 may be 0 nanometers in an example in which the metal silicide protrusion 128*a* is removed completely via performing the first treatment, the second treatment and/or the third treatment. In some examples, the second height 146 (of the metal silicide protrusion 128*a* after the second treatment) may be at most half, such as at most one-third or at most one-tenth, of the height 134 (of the metal silicide protrusion 128*a* before the second treatment). In some examples, the second width 144 (of the metal silicide protrusion 128*a* after the second treatment) may be at most half, such as at most one-third or at most one-tenth, of the width 132 (of the metal silicide protrusion 128*a* before the second treatment).

At 1006 (illustrated in FIG. 1E), the third treatment is performed (after performing the second treatment, for example) on the metal silicide layer 120 to remove one or more oxides on the first surface 122 of the metal silicide layer 120 and/or on the metal silicide protrusions 128. In an example, the one or more oxides removed via the third treatment may comprise oxide formed via the second treatment, such as oxide over the metal silicide protrusions 128. For example, the one or more oxides removed via the third treatment may comprise oxide structures 140 formed via the second treatment. In some examples, the third treatment comprises treating the first surface 122 with a second cleaning agent (e.g., the second cleaning agent may be applied to the first surface 122 and/or the oxide structures 140). In some examples, the second cleaning agent comprises one or more cleaning and/or etching chemicals, such as one or more gases, liquids and/or plasmas used for cleaning semiconductor surfaces and/or etching. In an example, the second cleaning agent comprises hydrogen fluoride (e.g., hydrofluoric acid), ammonium fluoride, hydrogen chloride (e.g., hydrochloric acid), and/or one or more other chemicals. In an example, the second cleaning agent comprises hydrofluoric acid, wherein a concentration of the hydrofluoric acid in the second cleaning agent is at most 10%, such as in the range of at least 0.1% to at most 5%, and/or in the range of at least 0.1% to at most 2%. In some examples, a composition of the second cleaning agent is about the same as a composition of the first cleaning agent. Alternatively and/or additionally, the composition of the second cleaning agent may be different than the composition of the first cleaning agent. In some examples, the third treatment comprises spraying (using a spray cleaning tool, for example) the second cleaning agent on the first surface 122 (e.g., such that the second cleaning agent is applied to the first surface 122 and/or the oxide structures 140). In some examples, a third treatment time of the third treatment (e.g., a duration of time that the metal silicide layer 120 is treated with and/or reacts with the second cleaning agent) is at most 120 seconds, such as in the range of at least 5 seconds to at most 60 seconds and/or in the range of at least 10 seconds to at most 20 seconds. In some examples, the third treatment time is longer than the first treatment time. Alternatively and/or additionally, the third treatment time may be shorter than the first treatment time. Alternatively and/or additionally, the third treatment time may be about the same as the first treatment time.

In some examples, as a result of the reducing the sizes of the metal silicide protrusions 128, at least some carbon on the first surface 122 of the metal silicide layer 120 may be exposed after performing the first treatment, the second treatment and/or the third treatment. For example, as shown in FIG. 1E, reducing the size of the metal silicide protrusion 128a exposes at least some of the portion 130a of the first carbon layer 130 (e.g., the portion 130a of the first carbon layer 130 was covered by the metal silicide protrusion 128a prior to the first treatment). In some examples, exposed carbon (e.g., at least some of the portion 130a of the first carbon layer 130 that is not covered by the metal silicide protrusion 128a) may be removed using one or more of the techniques provided herein, such as one or more of the techniques shown in and/or described with respect to FIGS. 1C and 1D.

In some examples, performing the first treatment, the second treatment and/or the third treatment may form recesses (e.g., craters) in the first surface 122 of the metal silicide layer 120. FIG. 1F is an illustration of the semiconductor device according to some examples in which recesses 152 are formed in the first surface 122. In some examples, the recesses 152 are formed during the third treatment. In some examples, the metal silicide protrusion 128a of the metal silicide protrusions 128 is within a recess 152a of the recesses 152. For example, the recess 152a may be formed around the metal silicide protrusion 128a (e.g., a portion, of the metal silicide layer 120, surrounding the metal silicide protrusion 128a may be removed via the first treatment, the second treatment and/or the third treatment to form the recess 152a). In some examples, one or more recesses of the recesses 152, such as a recess 152b, do not have a metal silicide protrusion within them. For example, a metal silicide protrusion may be removed (e.g., completely removed) during the first treatment, the second treatment and/or the third treatment. In an example, during the third treatment, a portion of the metal silicide layer 120, comprising a metal silicide protrusion and/or a portion of metal silicide layer 120 other than the metal silicide protrusion, may be removed to form the recess 152b. In some examples, a recess of the recesses 152 may extend between about 10 nanometers and about 100 nanometers into the metal silicide layer 120, such as between about 10 nanometers and about 70 nanometers into the metal silicide layer 120 (e.g., each recess of one, some and/or all of the recesses 152 may have a depth 154 that is between about 10 nanometers and about 100 nanometers, such as between about 10 nanometers and about 70 nanometers).

FIG. 2 is an illustration of an example method 200 for manufacturing a semiconductor device. At 202, a first surface (e.g., the first surface 122) of a metal silicide layer (e.g., the metal silicide layer 120) may be treated with an oxidizing agent to oxidize metal silicide protrusions (e.g., metal silicide protrusions 128) on the first surface of the metal silicide layer. In an example, the oxidizing agent comprises hydrogen chloride, such as hydrochloric acid, and/or hydrogen peroxide (e.g., the oxidizing agent may comprise hydrochloric acid and hydrogen peroxide). In an example, act 202 may comprise performing the second treatment shown in and/or described with respect to FIG. 1E. At 204, after treating the first surface with the oxidizing agent, the first surface may be treated with a cleaning agent to remove oxide over the metal silicide protrusions (e.g., oxide formed via act 202, such as oxide structures 140), wherein a size of a metal silicide protrusion of the metal silicide protrusions after treating the first surface with the cleaning agent is smaller than a size of the metal silicide protrusion prior to treating the first surface with the oxidizing agent. In an example, the cleaning agent comprises hydrogen fluoride, such as hydrofluoric acid. In an example, act 204 may comprise performing the third treatment shown in and/or described with respect to FIG. 1E.

Figure 3:
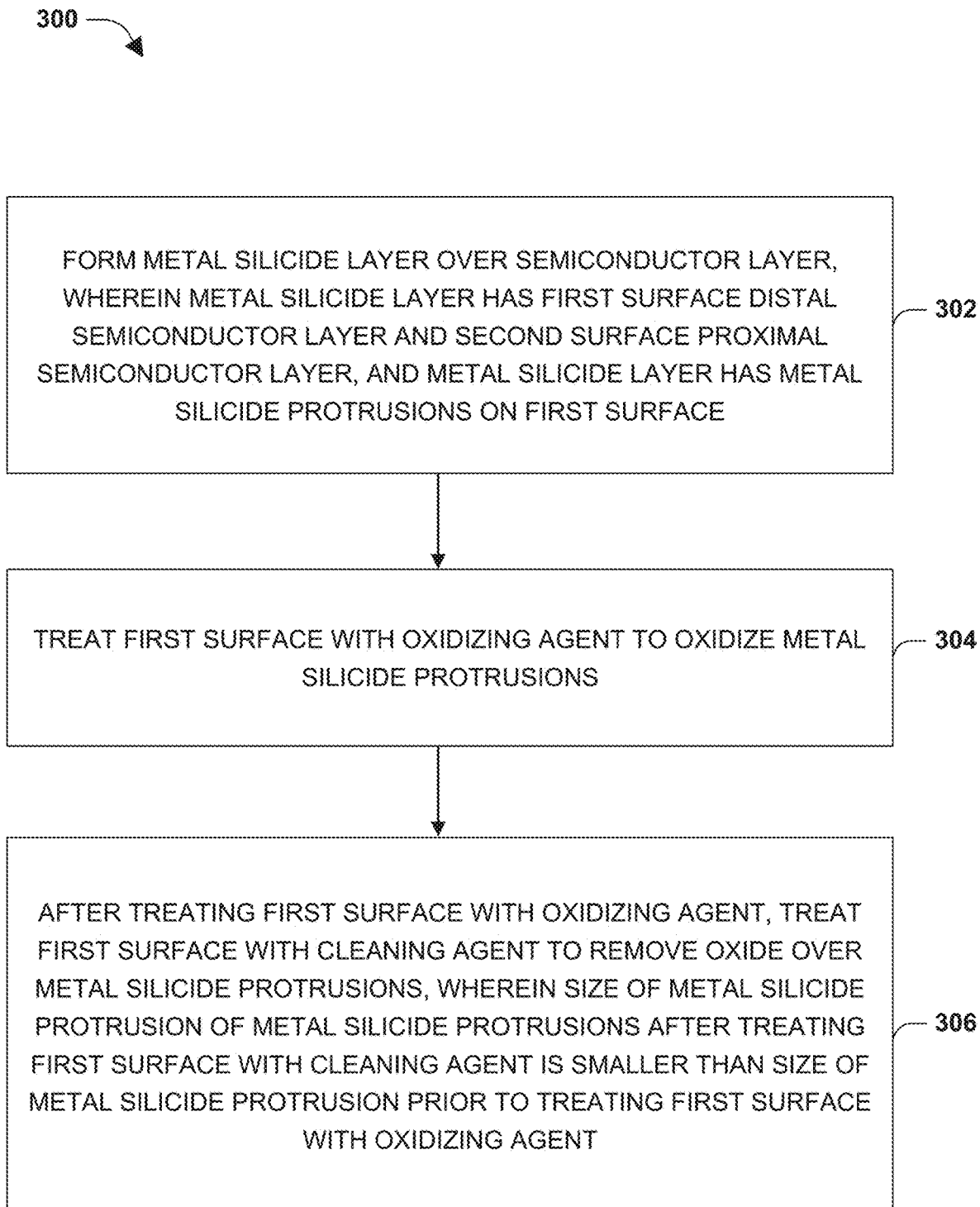
FIG. 3 is an illustration of an example method in accordance with the techniques presented herein.

FIG. 3 is an illustration of an example method 300 for manufacturing a semiconductor device. At 302, a metal silicide layer (e.g., the metal silicide layer 120) is formed over a semiconductor layer (e.g., the semiconductor layer 102, such as a SiC layer). The metal silicide layer has a first surface (e.g., the first surface 122) distal the semiconductor layer and a second surface (e.g., the second surface 124) proximal the semiconductor layer. The metal silicide layer has metal silicide protrusions (e.g., metal silicide protrusions 128) on the first surface. At 304, the first surface (e.g., the first surface 122) is treated with an oxidizing agent to oxidize the metal silicide protrusions. In an example, the oxidizing agent comprises hydrogen chloride, such as hydrochloric acid, and/or hydrogen peroxide (e.g., the oxidizing agent may comprise hydrochloric acid and hydrogen peroxide). In an example, act 304 may comprise performing the second treatment shown in and/or described with respect to FIG. 1E. At 306, after treating the first surface with the oxidizing agent, the first surface may be treated with a cleaning agent to remove oxide over the metal silicide protrusions (e.g., oxide formed via act 304, such as oxide structures 140), wherein a size of a metal silicide protrusion of the metal silicide protrusions after treating the first surface with the cleaning agent is smaller than a size of the metal silicide protrusion prior to treating the first surface with the oxidizing agent. In an example, the cleaning agent comprises hydrogen fluoride, such as hydrofluoric acid. In an example, act 306 may comprise performing the third treatment shown in and/or described with respect to FIG. 1E.

Figure 4:
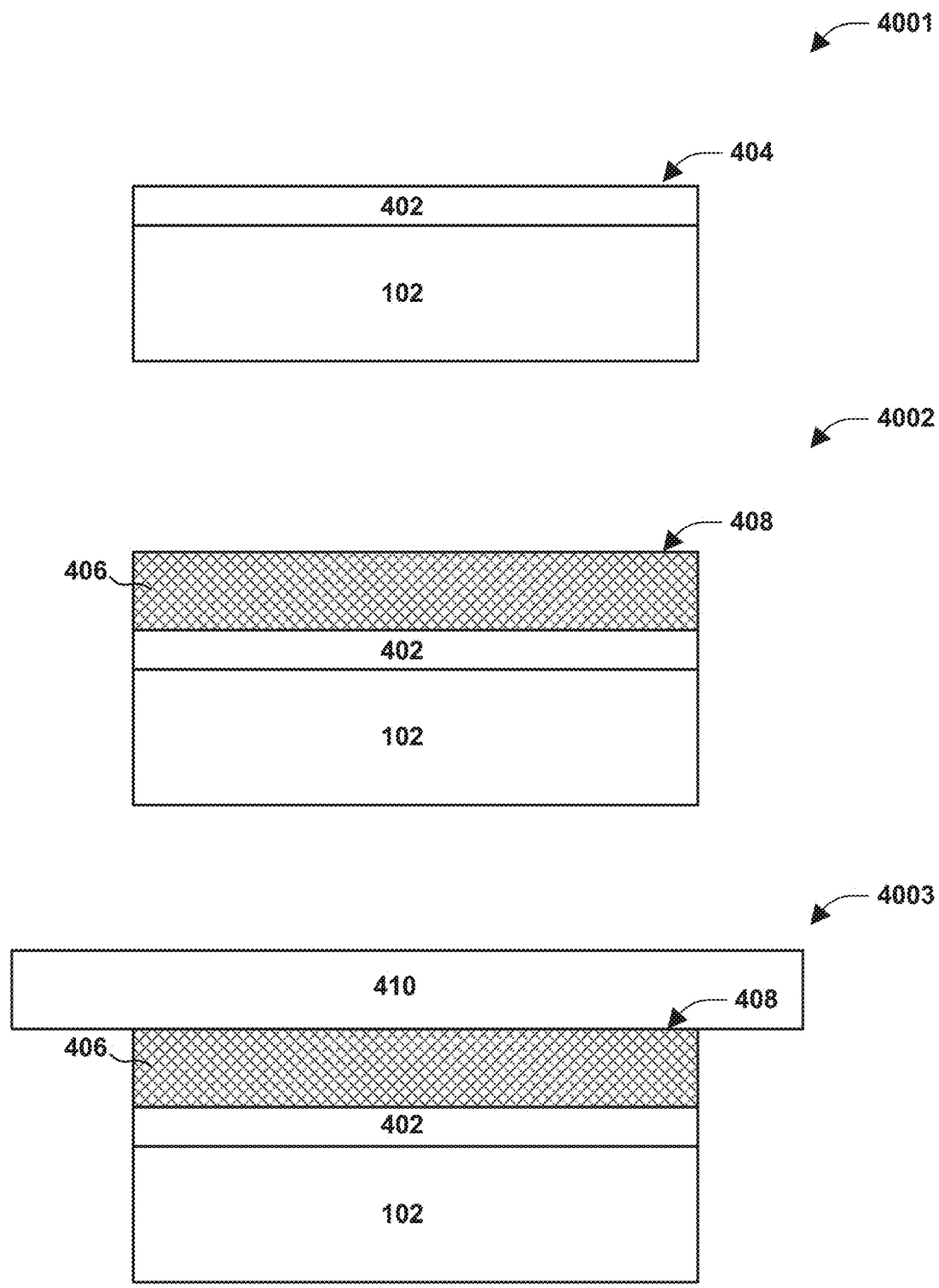
FIG. 4 schematically illustrates acts of manufacturing a semiconductor device according to various examples.

FIG. 4 illustrates aspects with respect to manufacturing a semiconductor device according to various examples of the present disclosure. At 4001, a semiconductor structure comprising the semiconductor layer 102 and a metal silicide layer 402 is provided. The metal silicide layer 402 may be formed using one or more of the techniques provided herein, such as shown in and/or described with respect to FIGS. 1A-1F, FIG. 2, and/or FIG. 3. For example, the metal silicide layer 402 may be formed to have a surface 404 with fewer and/or smaller metal silicide protrusions compared to a second metal silicide layer formed without using one or more of the techniques herein. In an example, the second metal silicide layer may be formed without oxidizing metal silicide protrusions and/or removing oxide over the metal silicide protrusions. A surface of the second metal silicide layer may have metal silicide protrusions with heights up to about 400 nanometers, and/or even up to about 1000 nanometers or 2000 nanometers. However, the surface 404 of the metal silicide layer 402 formed using one or more of the techniques provided herein may have less metal silicide protrusions than the surface of the second metal silicide layer. Alternatively and/or additionally, metal silicide protrusions of the surface 404 of the metal silicide layer 402 may have a maximum height of about 400 nanometers and/or a maximum height of about 200 nanometers.

In some examples, implementation of one or more of the techniques provided herein provides for a reduction in surface roughness of the surface 404 of the metal silicide layer 402 as compared to the second metal silicide layer that is formed without using one or more of the techniques herein. For example, implementation of one or more of the techniques provided herein may provide for a factor 6 reduction in average surface roughness (e.g., surface roughness parameter "Sa") as compared to the second metal silicide layer that is formed without using one or more of the techniques herein. In an example, one or more surface roughness parameters of the surface 404 of the metal silicide layer 402 may be lower as compared to a surface of the second metal silicide layer. In an example, a surface roughness parameter "Sa" (e.g., arithmetical mean height of surface) of the surface 404 of the metal silicide layer 402 may be 4 to 10 times lower than the surface roughness parameter "Sa" of the surface of the second metal silicide layer. In an example, the surface roughness parameter "Sa" of the surface 404 of the metal silicide layer 402 may be in the range of at least 5 nanometers to at most 100 nanometers, such as in the range of at least 5 nanometers to at most 50 nanometers or in the range of at least 5 nanometers to at most 20 nanometers or even to at most 15 nanometers, while the surface roughness parameter "Sa" of the surface of the second metal silicide layer may exceed 100 nanometers or 50 nanometers.

At 4002, one or more metal layers 406 are formed over the metal silicide layer 402. For example, the one or more metal layers 406 may be formed in a back side metal (BSM) process. In some examples, the one or more metal layers 406 may be in contact (e.g., direct contact) with the surface 404 of the metal silicide layer 402. In an example, the metal silicide layer 402 forms an electrical contact (e.g., an Ohmic contact) between the one or more metal layers 406 and the semiconductor layer 102. In some examples, a metal layer of the one or more metal layers 406 may be formed via a sputtering process, an evaporation deposition process, and/or one or more other deposition processes. In an example in which the metal silicide layer 402 has one or more recesses (e.g., craters) in the surface 404 (such as shown in and/or described with respect to FIG. 1F), one or more portions of a metal layer (e.g., a bottom-most metal layer) of the one or more metal layers 406 may be within the one or more recesses.

In some examples, the fewer and/or smaller metal silicide protrusions on the surface 404 of the metal silicide layer 402 results in fewer and/or smaller protrusions on a surface 408 of the one or more metal layers 406. In an example, the surface 408 of the one or more metal layers 406 may correspond to a top surface of a top-most metal layer of the one or more metal layers 406. In some examples, the surface 408 corresponds to a back side of a wafer comprising the semiconductor layer 102, the metal silicide layer 402 and/or the one or more metal layers 406. Alternatively and/or additionally, the reduction in surface roughness of the surface 404 of the metal silicide layer 402 results in a reduction in surface roughness of the surface 408 of the one or more metal layers 406.

At 4003, the wafer is affixed to a lead frame 410. In some examples, the top-most metal layer of the one or more metal layers 406 having the surface 408 is affixed to the lead frame 410. For example, the surface 408 of the top-most metal layer of the one or more metal layers 406 may be soldered to the lead frame 410, wherein the top-most metal layer may have a thickness that is larger than one, some and/or all other metal layers of the one or more metal layers 406. In some examples, there may be fewer and/or smaller voids between the surface 408 of the one or more metal layers 406 and the lead frame 410, such as due to the surface 408 having the fewer and/or smaller protrusions and/or due to the reduction in surface roughness of the surface 408. The fewer and/or smaller voids may provide for an improved electrical connection between the one or more metal layers 406 and the lead frame 410, which may provide for improved operation and/or performance a system comprising the wafer.

In some examples, the wafer may undergo a wafer testing process (e.g., the wafer testing process may be performed on the wafer prior to act 4003). In the wafer testing process, the surface 408 may be in contact (e.g., direct contact) with a measuring chuck that is configured to measure a current from the one or more metal layers 406. The surface 408 having the fewer and/or smaller protrusions and/or the reduction in surface roughness of the surface 408 may result in improved contact between the measuring chuck and the surface 408 (i.e., increased conductivity between the one or more metal layers 406 and the measuring chuck) such that current measurements (e.g., current measurements) in the wafer testing process are performed more accurately.

Some semiconductor devices formed without one or more of the techniques provided herein are formed with thicker metal layers in an attempt to bury metal silicide protrusions of a metal silicide layer. It may be appreciated that implementing one or more of the techniques provided herein enables the one or more metal layers 406 to be formed with reduced thicknesses, such as due to the surface 408 having the fewer and/or smaller protrusions and/or due to the reduction in surface roughness of the surface 408. The reduced thicknesses of the one or more metal layers 406 may provide for lower material costs and/or a smaller size of the semiconductor device.

It may be appreciated that some techniques typically used for surface smoothing of semiconductors, such as chemical-mechanical polishing and/or planarization (CMP), if performed on the metal silicide layer 402, may result in damaging the metal silicide layer 402 and/or do not smoothen the metal silicide layer 402. For example, performing CMP on the metal silicide layer 402 to smoothen the metal silicide layer 402 may damage the metal silicide layer 402 and/or remove portions of the metal silicide layer 402, thereby resulting in formation of an electrical contact (e.g., Ohmic contact) that does not function correctly.

According to some embodiments, a method for manufacturing a semiconductor device is provided. The method comprises treating a first surface of a metal silicide layer with an oxidizing agent to oxidize metal silicide protrusions on the first surface of the metal silicide layer, wherein the oxidizing agent comprises hydrogen chloride and/or hydrogen peroxide; and after treating the first surface with the oxidizing agent, treating the first surface with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent.

According to some embodiments, the method comprises, prior to treating the first surface with the oxidizing agent, removing carbon on the first surface of the metal silicide layer.

According to some embodiments, removing the carbon on the first surface of the metal silicide layer comprises treating the first surface with oxygen plasma.

According to some embodiments, oxide residue from the oxygen plasma remains on the first surface after treating the first surface with the oxygen plasma, wherein the method comprises prior to treating the first surface with the oxidizing agent, removing the oxide residue from the first surface.

According to some embodiments, removing the oxide residue comprises treating the first surface with a second cleaning agent.

According to some embodiments, a first treatment time of treating the first surface with the cleaning agent is different than a second treatment time of treating the first surface with the second cleaning agent.

According to some embodiments, a first treatment time of treating the first surface with the cleaning agent is about the same as a second treatment time of treating the first surface with the second cleaning agent.

According to some embodiments, the cleaning agent comprises hydrogen fluoride, and/or the second cleaning agent comprises hydrogen fluoride.

According to some embodiments, treating the first surface with the oxidizing agent comprises spraying the oxidizing agent on the first surface.

According to some embodiments, a method of manufacturing a semiconductor device is provided. The method comprises forming a metal silicide layer over a SiC layer, wherein the metal silicide layer has a first surface distal the SiC layer and a second surface proximal the SiC layer, and wherein the metal silicide layer has metal silicide protrusions on the first surface; treating the first surface with an oxidizing agent to oxidize the metal silicide protrusions; and after treating the first surface with the oxidizing agent, treating the first surface with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent.

According to some embodiments, the oxidizing agent comprises hydrogen chloride and/or hydrogen peroxide.

According to some embodiments, the method comprises, prior to treating the first surface with the oxidizing agent, removing carbon on the first surface of the metal silicide layer.

According to some embodiments, removing the carbon on the first surface of the metal silicide layer comprises treating the first surface with oxygen plasma.

According to some embodiments, oxide residue from the oxygen plasma remains on the first surface after treating the first surface with the oxygen plasma, wherein the method comprises prior to treating the first surface with the oxidizing agent, removing the oxide residue from the first surface.

According to some embodiments, removing the oxide residue comprises treating the first surface with a second cleaning agent.

According to some embodiments, the cleaning agent comprises hydrogen fluoride, and/or the second cleaning agent comprises hydrogen fluoride.

According to some embodiments, a first treatment time of treating the first surface with the cleaning agent is about the same as a second treatment time of treating the first surface with the second cleaning agent.

According to some embodiments, the method comprises forming a first layer, comprising silicon and a metal, over the SiC layer, wherein forming the metal silicide layer comprises directing thermal energy to the first layer to form the metal silicide layer from the metal of the first layer and silicon of the SiC layer.

According to some embodiments, the metal comprises nickel.

According to some embodiments, a semiconductor device is provided. The semiconductor device comprises a SiC layer; a metal silicide layer over the SiC layer, wherein the metal silicide layer has a first surface distal the SiC layer and a second surface proximal the SiC layer, wherein the metal silicide layer has recesses in the first surface, and wherein a recess of the recesses extends between about 10 nanometers and about 100 nanometers into the metal silicide layer; and a metal layer over the metal silicide layer, wherein a portion of the metal layer is within the recesses.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A method of manufacturing a semiconductor device, comprising:
    treating a first surface of a metal silicide layer with an oxidizing agent to oxidize metal silicide protrusions on the first surface of the metal silicide layer, wherein the oxidizing agent comprises at least one of hydrogen chloride (HCl) or hydrogen peroxide ($H_2O_2$); and
    after treating the first surface with the oxidizing agent, treating the first surface with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent.

2. The method of claim 1, comprising:
    prior to treating the first surface with the oxidizing agent, removing carbon on the first surface of the metal silicide layer.

3. The method of claim 2, wherein:
    removing the carbon on the first surface of the metal silicide layer comprises treating the first surface with oxygen plasma.

4. The method of claim 3, wherein oxide residue from the oxygen plasma remains on the first surface after treating the first surface with the oxygen plasma, the method comprising:

prior to treating the first surface with the oxidizing agent, removing the oxide residue from the first surface.

5. The method of claim 4, wherein:
    removing the oxide residue comprises treating the first surface with a second cleaning agent.

6. The method of claim 5, wherein:
    a first treatment time of treating the first surface with the cleaning agent is different than a second treatment time of treating the first surface with the second cleaning agent.

7. The method of claim 5, wherein:
    a first treatment time of treating the first surface with the cleaning agent is about the same as a second treatment time of treating the first surface with the second cleaning agent.

8. The method of claim 5, wherein at least one of:
    the cleaning agent comprises hydrogen fluoride (HF), or
    the second cleaning agent comprises hydrogen fluoride.

9. The method of claim 1, wherein:
    treating the first surface with the oxidizing agent comprises spraying the oxidizing agent on the first surface.

10. A method of manufacturing a semiconductor device, comprising:
    forming a metal silicide layer over a silicon carbide (SiC) layer, wherein:
        the metal silicide layer has a first surface distal the SiC layer and a second surface proximal the SiC layer, and
        the metal silicide layer has metal silicide protrusions on the first surface;
    treating the first surface with an oxidizing agent to oxidize the metal silicide protrusions; and
    after treating the first surface with the oxidizing agent, treating the first surface with a cleaning agent to remove oxide over the metal silicide protrusions, wherein a size of a metal silicide protrusion of the metal silicide protrusions after treating the first surface with the cleaning agent is smaller than a size of the metal silicide protrusion prior to treating the first surface with the oxidizing agent.

11. The method of claim 10, wherein:
    the oxidizing agent comprises at least one of hydrogen chloride (HCl) or hydrogen peroxide ($H_2O_2$).

12. The method of claim 10, comprising:
    prior to treating the first surface with the oxidizing agent, removing carbon on the first surface of the metal silicide layer.

13. The method of claim 12, wherein:
    removing the carbon on the first surface of the metal silicide layer comprises treating the first surface with oxygen plasma.

14. The method of claim 13, wherein oxide residue from the oxygen plasma remains on the first surface after treating the first surface with the oxygen plasma, the method comprising:
    prior to treating the first surface with the oxidizing agent, removing the oxide residue from the first surface.

15. The method of claim 14, wherein:
    removing the oxide residue comprises treating the first surface with a second cleaning agent.

16. The method of claim 15, wherein at least one of:
    the cleaning agent comprises hydrogen fluoride (HF), or
    the second cleaning agent comprises hydrogen fluoride.

17. The method of claim 15, wherein:
a first treatment time of treating the first surface with the cleaning agent is about the same as a second treatment time of treating the first surface with the second cleaning agent.

18. The method of claim 10, comprising:
forming a first layer, comprising a metal, over the SiC layer, wherein forming the metal silicide layer comprises directing thermal energy to the first layer to form the metal silicide layer from the metal of the first layer and silicon of the SiC layer.

19. The method of claim 18, wherein:
the metal comprises nickel.

* * * * *